United States Patent
Hsu et al.

(10) Patent No.: US 9,806,255 B1
(45) Date of Patent: Oct. 31, 2017

(54) RESISTIVE RANDOM ACCESS MEMORY AND METHOD OF FORMING THE SAME

(71) Applicant: UNITED MICROELECTRONICS CORP., Hsin-Chu (TW)

(72) Inventors: Chia-Ching Hsu, Yunlin County (TW); Liang Yi, Singapore (SG); Shen-De Wang, Hsinchu County (TW); Ko-Chi Chen, Taoyuan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/455,142

(22) Filed: Mar. 10, 2017

(30) Foreign Application Priority Data

Jan. 23, 2017 (TW) .............................. 106102374 A (51) Int. Cl.
*H01L 45/00* (2006.01)
*H01L 27/24* (2006.01)

(52) U.S. Cl.
CPC ...... *H01L 45/1233* (2013.01); *H01L 27/2463* (2013.01); *H01L 45/08* (2013.01); *H01L 45/1246* (2013.01); *H01L 45/1253* (2013.01); *H01L 45/146* (2013.01); *H01L 45/16* (2013.01)

(58) Field of Classification Search
CPC ..... H01L 45/1233; H01L 45/16; H01L 45/08; H01L 27/2463; H01L 45/146; H01L 45/1246; H01L 45/1253
See application file for complete search history.

(56) References Cited

U.S. PATENT DOCUMENTS 9,230,647 B2  1/2016  Tsai
2009/0039332 A1*  2/2009  Lee .......................... H01L 45/04
                                                    257/4

OTHER PUBLICATIONS

Hsu, Title of Invention: Semiconductor Device Having Memory Cell Structure, U.S. Appl. No. 15/367,690, filed Dec. 2, 2016.

* cited by examiner

*Primary Examiner* — Kyoung Lee
(74) *Attorney, Agent, or Firm* — Winston Hsu (57) ABSTRACT

A resistive random access memory includes a lower electrode, an upper electrode and a resistive layer between the lower electrode and the upper electrode, wherein the resistive layer includes a constant-resistance portion and a variable-resistance portion surrounding the constant-resistance portion.

20 Claims, 9 Drawing Sheets

RESISTIVE RANDOM ACCESS MEMORY AND METHOD OF FORMING THE SAME

BACKGROUND OF THE INVENTION

1. Field of the Invention

The present invention generally relates to a resistive random access memory (RRAM) and the method of forming the same, and particular relates to a resistive random access memory having an L-shaped variable resistance portion and the method of forming the same.

2. Description of the Prior Art

Resistive random-access memory (RRAM) is a type of non-volatile memory (NVM), and has the advantages such as smaller feature size, fast processing speed, longer data retention, lower power consumption, better reliability and may be formed conventionally integrated with conventional semiconductor process, it therefore has drawn high interest in the field. The basic structure of a RRAM cell includes a top electrode overlapping on a bottom electrode wherein the top electrode and the bottom electrode are separated from each other by a variable-resistance layer sandwiched therebetween. The variable-resistance layer may undergo a phase change between a high resistance state (HRS) and a low resistance state (LRS) when being properly biased. The different resistance states are compiled into either "1" or "0" representatively to store data.

Generally, the phase-changing behavior of a RRAM cell is interpreted as the filament theory. When an external voltage bias is applied on a RRAM cell which is initially at the high resistance state and having a resistance $R_{off}$, a relatively small amount of current will flow between the top electrode and the bottom electrode. The heat resulting from the small amount of current between the top electrode and the bottom electrode may drive the intrinsic crystal defects such as oxygen vacancies of the variable-resistance layer to migrate and rearrange. With some probability when the external voltage bias reaches a set threshold voltage ($V_{set}$), the crystal defects within the variable-resistance layer may be rearranged to collectively form a contentious electron transmitting path, also known as a conductive filament, between the top electrode and the bottom electrode. At that point, the resistance of the RRAM cell drops suddenly and the current increases dramatically in response, and the RRAM cell is then switched from the initially high resistance state to the low resistance state having a resistance $R_{on}$. The process aforesaid is also known as a foaming process. The RRAM may still remain in the low resistance state even when the external voltage bias is removed. Therefore, the data has been stored.

When the RRAM cell at the low resistance state is biased with another external voltage bias at another time, a large current may be conducted between the top electrode and the bottom electrode, and the heat generated from the current may disorder the contentiously-arranged crystal defects of the conductive filament formed in the variable-resistance layer. With some probability when the external voltage bias reaches a reset threshold voltage ($V_{reset}$), the conductive filament may be fractured, leading to a sudden increase of the resistance of the RRAM cell, and the conducted current between the top electrode and the bottom electrode decreases dramatically in response. Consequently, the RRAM cell is reversely switched from the low resistance state to the high resistance state, and the stored data is then erased.

Since the data storage of the RRAM cell is achieved by the switching of the RRAM cell between different resistance states, the property of having stable $R_{on}$ and $R_{off}$ is critical for the performance of the RRAM cell. Meanwhile, the purpose of forming the RRAM conveniently integrated with the current semiconductor process is also under extensive development.

SUMMARY OF THE INVENTION

One objective of the present invention is to provide a RRAM having lower foaming voltage, better foaming efficiency and more stable $R_{off}$ and $R_{on}$ therefore achieving better performance.

According to one embodiment of the present invention, a RRAM is provided, including a bottom electrode and a top electrode overlapping on the bottom electrode. A resistance layer is disposed between the top electrode and the bottom electrode, wherein the resistance layer includes a constant resistance portion and a variable resistance portion encompassing the constant resistance portion.

According to another embodiment of the present invention, a RRAM is provided, including a bottom electrode and a top electrode overlapping on the bottom electrode. A dielectric layer having a constant resistance is disposed between the top electrode and the bottom electrode. A first spacer having a variable resistance is disposed on the bottom electrode, covering the sidewall of the top electrode and having an extending portion completely filling a recess between the top electrode, the bottom electrode and the dielectric layer. A second spacer is disposed on the bottom electrode and covering the sidewall of the first spacer.

According to still another embodiment of the present invention, a RRAM is provided including a bottom electrode and a dielectric layer formed on the bottom electrode, overlapping a portion of the bottom electrode. An L-shaped first spacer having a variable resistance covers a sidewall of the dielectric layer and a portion of the bottom electrode. A top electrode is disposed on the L-shaped first spacer, overlapping a region of the bottom electrode wherein the top electrode and the bottom electrode are completely separated by the L-shaped first spacer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The above and other aspects and features of the present invention will become apparent by describing in detail exemplary embodiments thereof with reference to the attached drawings. Various structures shown in the drawings are not necessarily drawn to scale, and structural, logical, and electrical changes may be made in other embodiments without departing from the scope of the present invention.

DETAILED DESCRIPTION

To provide a better understanding of the present invention to those of ordinary skill in the art, several exemplary embodiments will be detailed as follows, with reference to the accompanying drawings using numbered elements to elaborate the contents and effects to be achieved.

Please refer to FIG. 1 to FIG. 7, which are schematic diagrams illustrating the process of forming a RRAM cell according to a first embodiment of the present invention.

Figure 1:
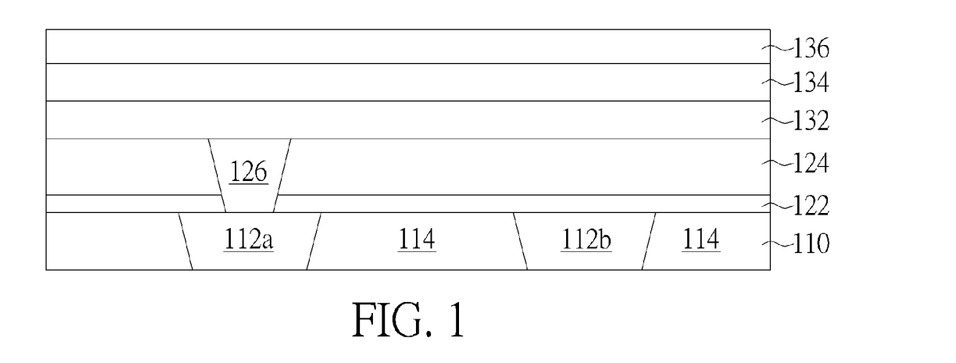
FIG. 1 to FIG. 7 are schematic diagrams illustrating the process of forming a RRAM cell according to a first embodiment of the present invention.

Firstly, as shown in FIG. 1, a substrate 110 is provided. The RRAM cell according to the present invention is formed integrated with the process of forming the metal interconnecting structure. According to the embodiment, the RRAM cell is formed between two metal layers, such as between an $N^{th}$ metal layer and an $(N+1)^{th}$ metal layer of the metal interconnecting structure wherein N is a natural number equal to or larger than 1. It should be understood that the RRAM may also be formed in one of the metal layers or in a higher layer. The substrate 110 may be at a semi-manufactured stage of the manufacturing process. For example, the substrate 110 may have finished the front-end-online (FEOL) processes including forming, for example, isolations structures, transistors and contacts, and at least has formed a metal interconnecting layer of the back-end-online (BEOL) processes for electrically connecting the bottom electrode of the RRAM to be formed. The substrate 110 may also be any suitable substrate wherein a RRAM may be fabricated thereon. For the sake of simplicity, only one metal layer and one interlayer dielectric 114 is shown in the drawings wherein the metal layer at least includes a metal 112a connecting to a RRAM cell and a metal 112b connecting to a peripheral circuit. A barrier 122 and another interlayer dielectric 124 are formed successively on the substrate 110. A via 126 through the whole thickness of the interlayer dielectric 124 and the barrier 122 is formed directly above the metal 112a to electrically connect to the metal 112a. After that, a bottom electrode material layer 132, a dielectric material layer 134 and a top electrode material layer 136 are successively formed on the substrate 110. The metals 112a and 112b may be made of metal typically used to form the interconnecting structure, such as aluminum (Al), copper (Cu) or tungsten (W), but not limited thereto. The interlayer dielectrics 114 and 124 may be made of the same or different materials, such as silicon oxide ($SiO_2$), un-doped silicon glass (USG), fluorine-doped silicon glass (FSG) or other applicable low-k dielectric materials, but not limited thereto. The barrier 122 may be made of silicon nitride (SiN), silicon oxynitride (SiON) or silicon carbide (SiC), but not limited thereto. The bottom electrode material layer 132 and the top electrode material layer 136 may be made of the same or different metals chosen from a group including titanium (Ti), titanium nitride (TiN), tantalum (Ta), tantalum nitride (TaN), platinum (Pt), iridium (Ir), ruthenium (Ru), aluminum (Al), copper (Cu), gold (Au), tungsten (W), and tungsten nitride (WN), but not limited thereto. The thicknesses of the bottom electrode material layer 132 and the top electrode material layer 136 may be the same or different, ranging from 50 to 500 angstroms. The dielectric material layer 134 may be made of silicon oxide ($SiO_2$), silicon nitride (SiN), silicon carbide (SiC) or other materials having constant resistance. The dielectric material layer 134 may have a thickness ranging from 50 to 300 angstroms. The via 126 may be made of aluminum (Al), copper (Cu) or tungsten (W), but not limited thereto. Optionally, the via 126 may be made of the same material as the bottom electrode material layer 132 by filling the hole of the via 126 concurrently when forming the bottom electrode material layer 132.

Figure 2:
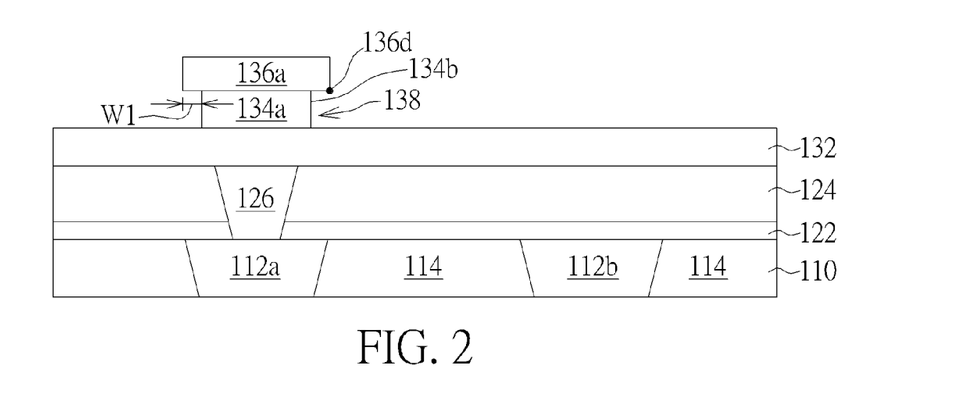

Please refer to FIG. 2. A patterning process such as a photolithography-etching process is then performed to define the top electrode material layer 136 and the dielectric material layer 134 into a top electrode 136a and a dielectric layer 134a. The patterning process, for example, may include forming a patterned hard mask layer (not shown) over the top electrode material layer 136 firstly to partially cover a portion of the top electrode material layer 136. An etching process is then performed using the patterned hard mask layer as an etching mask to remove the un-covered portion of the top electrode material layer 136 and further removing the dielectric material layer 134 underneath, until the bottom electrode material layer 132 is exposed. The pattern defined in the patterned hard mask layer is then transferred to the top electrode material layer 136 and the dielectric material layer 134, forming the top electrode 136a and the dielectric layer 134a directly underneath. It should be noticed that the bottom electrode material layer 132 is substantially not etched to form any pattern during the aforesaid patterning process. After the forming the top electrode 136a and the dielectric layer 134a, a selective etching process is carried out to laterally remove a portion of the dielectric layer 134a from its sidewall 134b. As shown in FIG. 2, the sidewall 134b of the dielectric layer 134a is trimmed inwardly and consequently forms a recess 138 encompassed by the top electrode 136a, the dielectric layer 134a and the bottom electrode material layer 132 in three sides. It is noteworthy that a bottom corner 136d of the top electrode 136a is exposed. According to the embodiment, the recess 138 may have a pre-determined width $W_1$ ranging from 0 to 150 angstroms. Although it is not shown in the drawing, a remaining hard mask may still cover the top surface of the top electrode to protect the top electrode 136a from being damaged badly during the following process of etching the bottom electrode material layer 132 to form a bottom electrode 132a (shown in FIG. 6).

Figure 3:
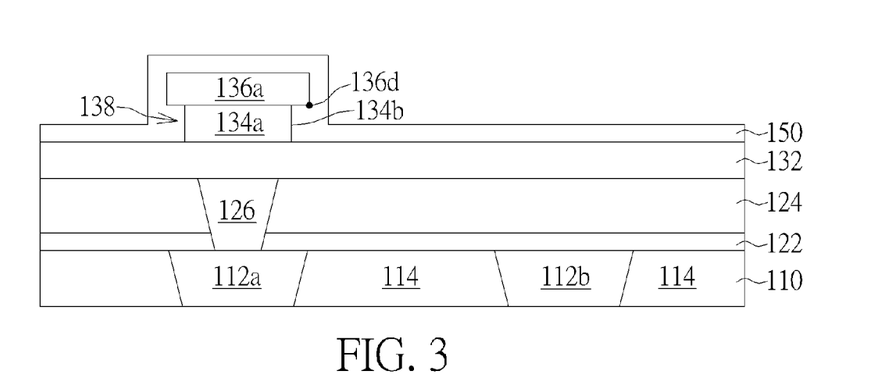

Please refer to FIG. 3. A spacer material layer 150 is then formed blanketly and conformally covering the bottom electrode material layer 132, the top electrode 136a and filling into the recess 138. The dielectric layer 134a is in direct contact with the spacer material layer 150. The spacer material layer 150 may be made of a variable-resistance material, such as nickel oxide (NiO), titanium dioxide (TiO), zinc oxide (ZnO), zirconium oxide (ZrO), hafnium oxide (HfO), tantalum oxide (TaO) or other transition metal oxides (TMO), but not limited thereto. According to an embodiment, the spacer material layer 150 may have a thickness ranging from 25 to 150 angstroms, but not limited thereto.

Figure 4:
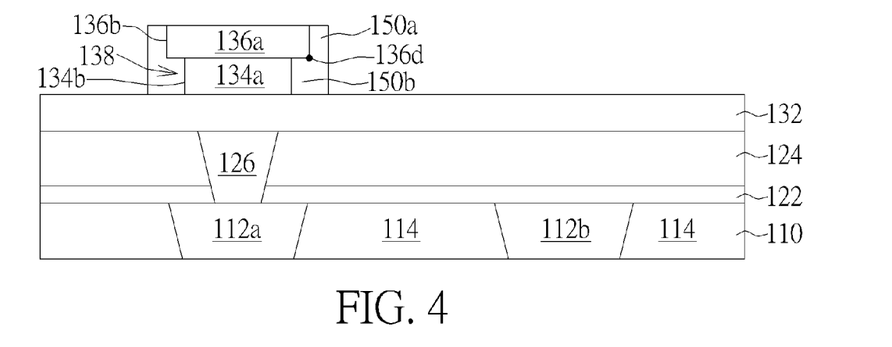

Please refer to FIG. 4. Subsequently, an etching process is carried out to anisotropically remove a portion of the first material layer 150, thereby forming a first spacer 150a. The first spacer 150a has an L-shaped cross-sectional profile, vertically covering the sidewall 136b of the top electrode 136a and the sidewall 134b of the dielectric layer 134a, and has an extending portion 150b extending laterally under the top electrode 136a to completely fill the recess 138. It is noteworthy that the bottom corner 136d of the top electrode 136a is encompassed by the first spacer 150a and is not exposed after forming the first spacer 150a. It should be understood that when viewing from the top, the sidewall 134b of the top electrode 134a and the sidewall 136b of the dielectric layer 136a are surrounded by the first spacer 150, as will be shown later in FIG. 8.

Figure 5:
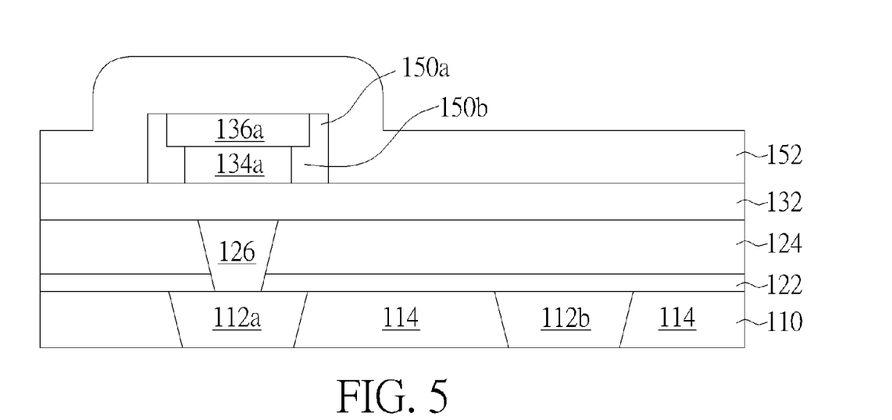
Figure 6:
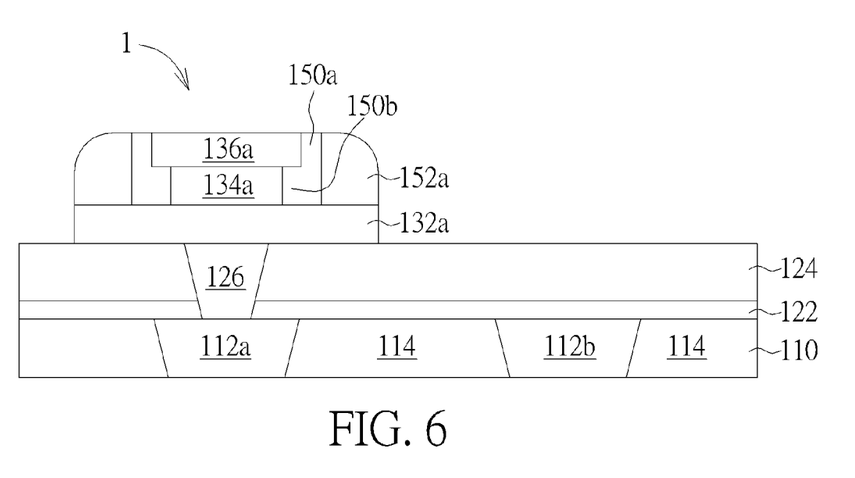

Please refer to FIG. 5 and FIG. 6. A second spacer material layer 152 including, for example, silicon nitride (SiN) or a silicon oxide ($SiO_2$), is formed blanketly on the substrate 110, and then is anisotropically etched to forma second spacer 152a on the first spacer 150a. Subsequently, by using the second spacer 152a, the first spacer 150a and the top electrode 136a (may have remaining hard mask thereon) as an etching mask to etch away the exposed bottom electrode material layer 132, the bottom electrode 132a directly under the top electrode 136a is formed and the RRAM cell 1 according to the first embodiment is obtained. One feature of the present invention is that, the bottom electrode 132a is formed self-aligning to the edge of the second spacer 152a, therefore only one patterning process as shown previously in FIG. 1 and FIG. 2 is required to form the RRAM 1 with different top electrode and bottom electrode areas, wherein a larger area of the bottom electrode 132a is able to avoid the exposure of the via 126.

Figure 7:
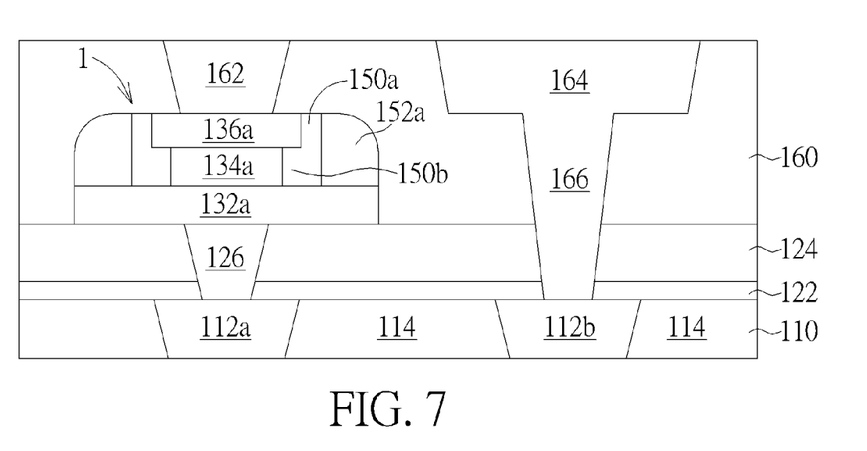

Please refer to FIG. 7. More processes are performed to form the other interconnecting structures, including, for example, an interlayer dielectric 160, a via 162 in the interlayer dielectric 160 and directly above the top electrode 136a to electrically couple the top electrode 136a, a metal 164 and a via 166 electrically coupling the metal 112b to the metal. The first spacer 150a and the second spacer 152a may serve as an etching stop layer when forming the via 162, preventing the issue of direct contact between the via 162 and the bottom electrode 132a when the via 162 misaligned. Therefore, the process of forming the RRAM cell 1 has a larger process window.

Figure 8:
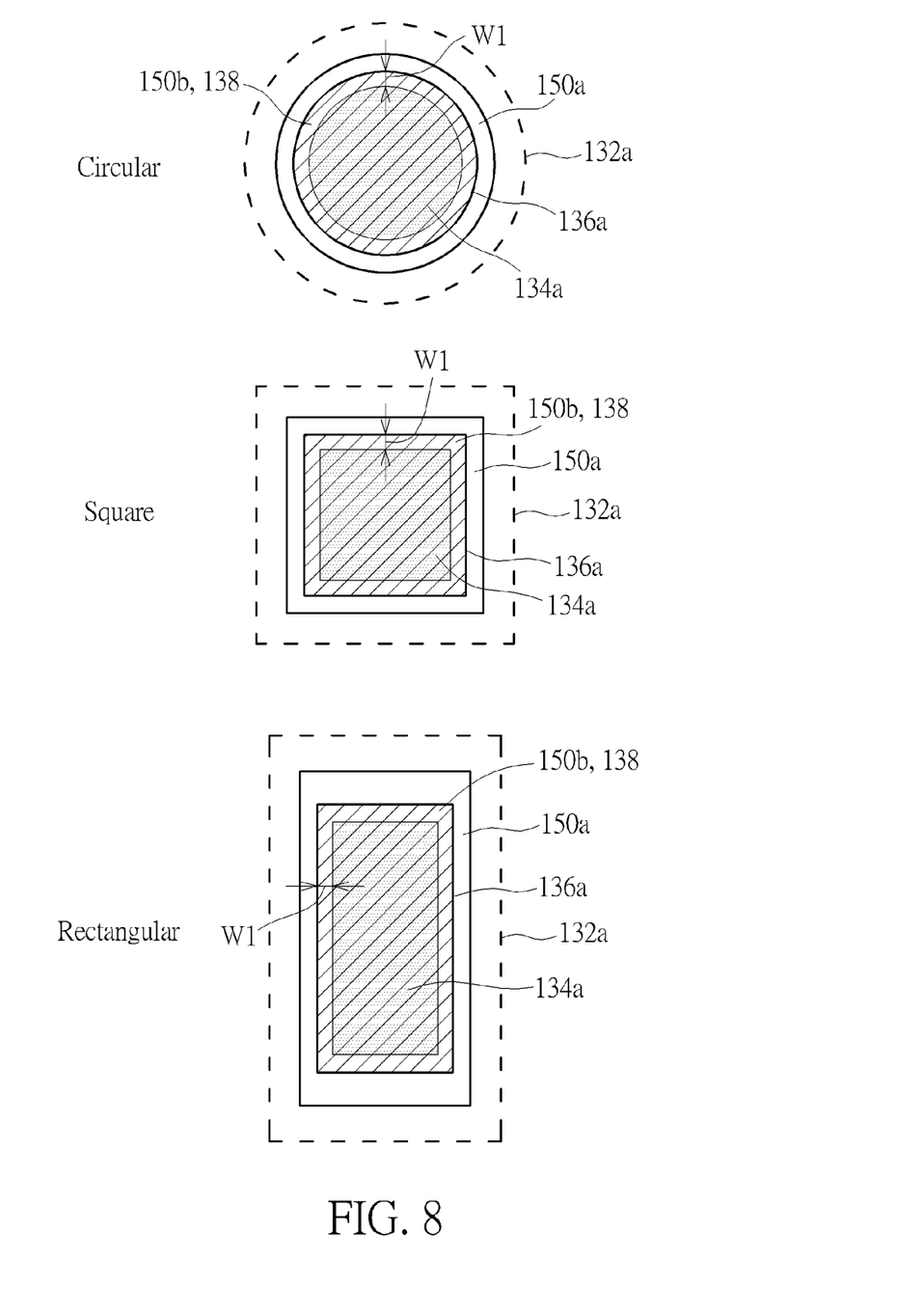
FIG. 8 is a schematic diagram exemplarily showing top views of some RRAM cells formed according to the first embodiment.

Please refer to FIG. 8, which shows the exemplarily top views of some RRAM cells formed according to the first embodiment. For ease of illustration and description, the top electrode 136a in each example shown in FIG. 8 is drawn to be partially translucent to show the dielectric layer 134b and the extending portion 150b of the first spacer 150 directly under the top electrode 136a. Apparently as shown in FIG. 8, the bottom electrode 132a has an area larger than the top electrode 136a. A constant-resistance portion (that is the dielectric layer 134a) and a ring-shaped variable-resistance portion (that is the extending portion 150b of the first spacer 150a) surrounding the constant resistance portion are sandwiched between the top electrode 136a and the bottom electrode 132a. According to the embodiment, the ring-shaped variable-resistance portion may be a circular ring, a square ring or a rectangular ring as shown in FIG. 8. Although it is not shown in FIG. 8, the ring-shaped variable-resistance portion may be a symmetrical or an asymmetrical polygon ring in other embodiments.

Another feature of the present invention is that, by including the constant-resistance portion (the dielectric layer 134a) into the entirety of the "resistance layer" sandwiched between the top electrode and the bottom electrode, the proportion of the variable-resistance portion (the first spacer 150a) in the entirety of the resistance layer of the RRAM cell 1 may be reduced, which is beneficial to achieve a stable $R_{off}$ when the RRAM cell 1 is at the high resistance state. Additionally, by forming a recess between the top electrode, the bottom electrode and the constant-resistance portion and forming the variable-resistance portion in the manner surrounding the mandrel-like top electrode and the dielectric layer, a bottom corner of the top electrode is completely encompassed by the variable-resistance portion. In this way, the strong electrical field formed at the bottom corner 136d may efficiently facilitate the foaming process to form the conductive filament or fracture a formed filament reversely. Consequently, lower threshold voltages $V_{set}$ and $V_{reset}$ may be achieved. Furthermore, the conductive filament tends to form adjacent to the bottom corner 136d of the top electrode 136a where a larger electrical field is provided. Therefore a more stable $R_{on}$ of the RRAM cell 1 at the low resistance state may be achieved.

According to a variance type of the first embodiment, the top electrode, the bottom electrode and the constant-resistance dielectric layer sandwiched therebetween are patterned in the same patterning process. In this way, the top electrode and the bottom electrode may have the same size of area and completely overlap with each other. Similarly, the dielectric layer would also be laterally recessed to form the recess between the top electrode, the bottom electrode and the dielectric layer, wherein the bottom corner of the top electrode and the top corner of the bottom electrode are both exposed. Subsequently, a variable-resistance first spacer is formed surrounding the mandrel-like top electrode, dielectric layer and the bottom electrode, and encompassing both the bottom corner of the top electrode and the top corner of the bottom electrode. According to the variance type, the variable-resistance first spacer substantially has a 90-degree-rotated T-shape cross-sectional profile. The first spacer not only surrounds the sidewalls of the top electrode and the dielectric layer, but also surrounds the sidewall of the bottom electrode.

Figure 9:
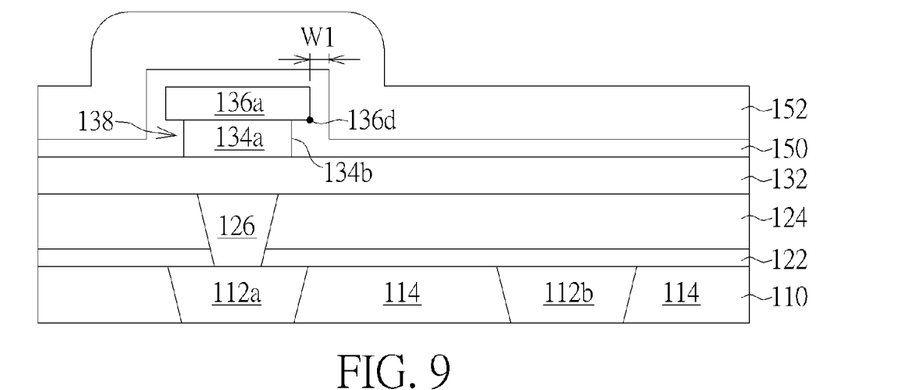
FIG. 9 to FIG. 11 are schematic diagrams illustrating the process of forming a RRAM cell according to a second embodiment of the present invention.
Figure 10:
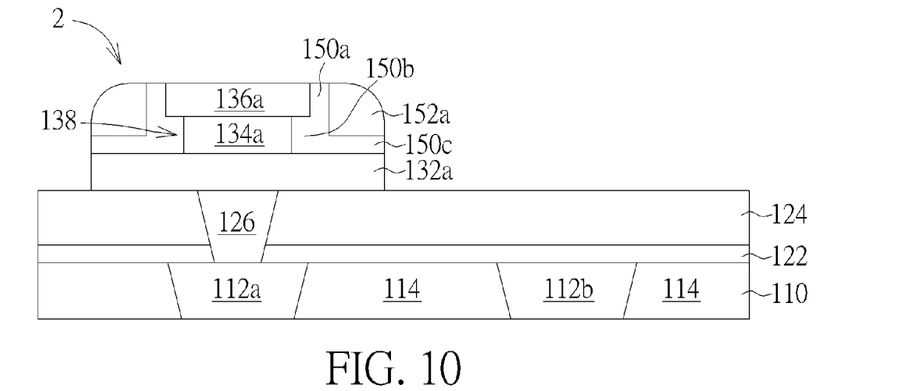
Figure 11:
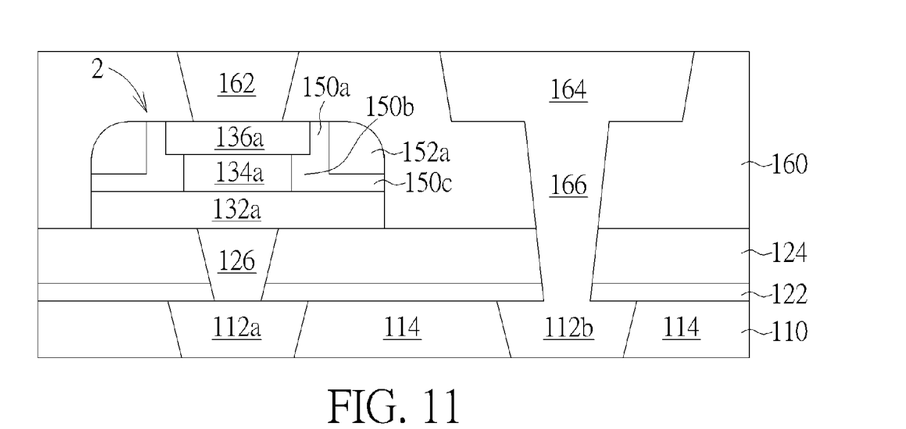

FIG. 9 to FIG. 11 are schematic diagrams illustrating the process of forming a RRAM cell 2 according to a second embodiment of the present invention. The difference between the first embodiment and the second embodiment is that in the second embodiment, the first spacer 150 substantially has an upside-down T-shaped cross-sectional profile.

Please refer to FIG. 9. Firstly, a substrate 110 is provided. Processes as illustrated in FIG. 1 to FIG. 2 are performed to form the top electrode 136 and the dielectric layer 134a on the substrate 110, wherein a recess 138 is formed between the top electrode 136a, the bottom electrode material layer 132 and the dielectric layer 134a. A first spacer material layer 150 and a second spacer material layer 152 are successively formed on the substrate 110, blanketly and conformally covering the bottom electrode material layer 132, the top electrode 136a and filling the recess 138. The bottom corner 136d of the top electrode 136a is also encompassed by the first spacer 150a and is not exposed.

Please refer to FIG. 10 and FIG. 11. Afterward, an etching process is performed to remove a portion of the first spacer material layer 150 and a portion of the second spacer material layer 152 at the same time, thereby forming a first spacer 150a and a second spacer 152a accordingly and exposing a portion of the bottom electrode material layer 132. A bottom electrode 132a is then formed by etching away the exposed bottom electrode material layer 132 in the manner using the second spacer 152a, the first spacer 150a and the top electrode 136a (may have remained hard mask thereon) as an etching mask to remove the exposed portion of the bottom electrode material layer 132. The RRAM cell 2 according to the second embodiment is then obtained. As shown in FIG. 10, the first spacer 150a of the RRAM cell 2 has an upside-down T-shape cross-sectional profile, having an extending portion 150b extending laterally under the top electrode 136a to fill the recess 138 and another extending portion 150c extending between the second spacer 152a and the bottom electrode 132a. Similarly, other interconnecting structures such as the interlayer dielectric layer 160, the metal 164 and the via 162 are then formed, as shown in FIG. 11.

FIG. 12 to FIG. 16 are schematic diagrams illustrating the process of forming a RRAM cell 3 according to a third embodiment of the present invention. The third embodiment differs from the first embodiment and the second embodiment in that a top electrode 336a and a variable-resistance first spacer 350a of the RRAM cell 3 are both formed surrounding a mandrel-like constant-resistant dielectric layer. The top electrode of the RRAM cell 3 is disposed directly above a peripheral region of the bottom electrode rather than being disposed above a center region of the bottom electrode as that in the first embodiment and the second embodiment.

Figure 12:
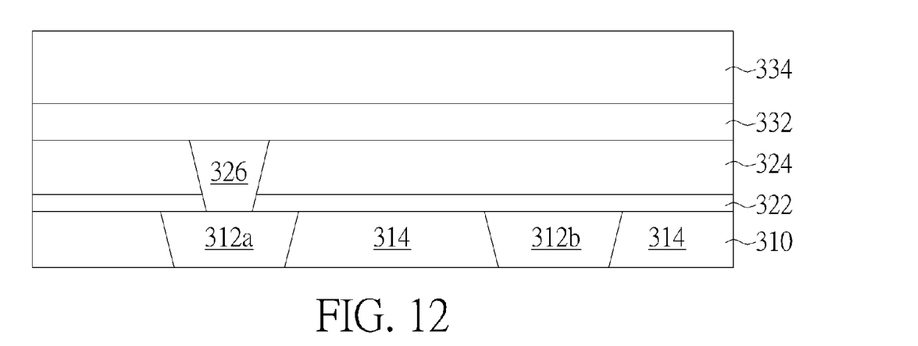
FIG. 12 to FIG. 15 are schematic diagrams illustrating the process of forming a RRAM cell according to a third embodiment of the present invention.

Please refer to FIG. 12. Similarly, a substrate 310 having a metal 312a and a metal 312b formed in an interlayer dielectric 314 is provided. A barrier 322 and an interlayer dielectric 324 are successively deposited on the substrate 310 and wherein a via 326 directly above the metal 312a is formed through the whole thickness of the barrier 322 and the interlayer dielectric 324 to electrically couple with the metal 312a. A bottom electrode material layer 332 and a dielectric material layer 334 are then formed on the substrate 310, blankety covering the via 326 and interlayer dielectric 324. The metal 312a, 312b and the via 326 may be made of typical metal materials usually used to form the interconnecting structure, such as aluminum (Al), copper (Cu) or tungsten (W), but not limited thereto. The interlayer dielectric 314 and interlayer dielectric 324 may be made of the same or different material including silicon oxide (SiO2), un-doped silicon glass (USG), fluorine-doped silicon glass (FSG) or other low-k dielectric materials, but not limited thereto. The bottom electrode material layer 332 may be made of titanium (Ti), titanium nitride (TiN), tantalum (Ta), tantalum nitride (TaN), platinum (Pt), iridium (Ir), ruthenium (Ru), aluminum (Al), copper (Cu), gold (Au), tungsten (W), and tungsten nitride (WN), but not limited thereto. The bottom electrode material layer 332 may have a thickness ranging from 50 to 300 angstroms. The dielectric material layer 334 may be made of silicon oxide (SiO$_2$), silicon nitride (SiN) or silicon carbon nitride (SiCN), but not limited thereto. The dielectric material layer 334 may have a thickness ranging from 500 to 1000 angstroms, but not limited thereto. Preferably, the dielectric layer 334 is made of a material having etching selectivity with respect to the interlayer dielectric layer 360 (shown in FIG. 15) formed in the later process, for being able to serve as an etching stop layer over the bottom electrode 332a when forming the via 362 (shown in FIG. 15). This may help to prevent the direct contact between the via 362 and the bottom electrode 332a.

Figure 13:
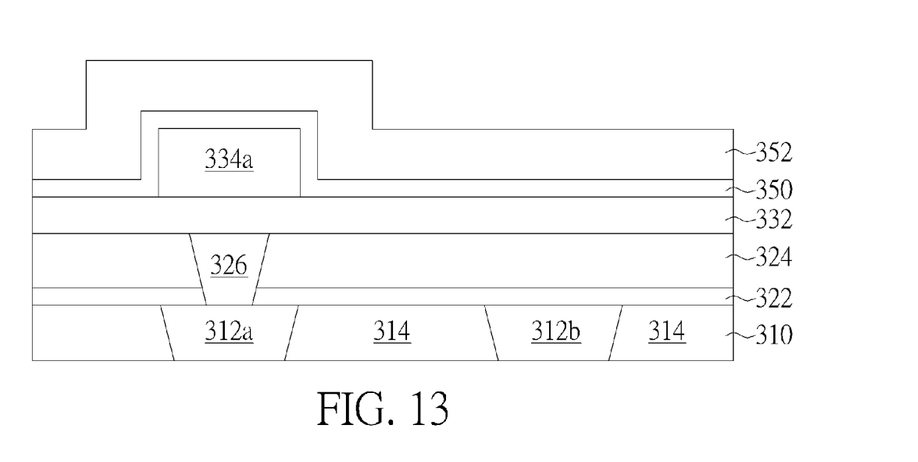

Please refer to FIG. 13. A patterning process such as a photolithography-etching process is performed to pattern the dielectric material 334 into a dielectric layer 334a. A first spacer material layer 350 and a top electrode material layer 336 are then formed on the substrate 310, blankety and conformally covering the bottom electrode material layer 332 and the dielectric layer 334a. The first spacer material layer 350 is made of a variable-resistance material such as nickel oxide (NiO), titanium dioxide (TiO), zinc oxide (ZnO), zirconium oxide (ZrO), hafnium oxide (HfO), tantalum oxide (TaO) or other transition metal oxides (TMO), and may have a thickness ranging from 50 to 200 angstroms, but not limited thereto. The top electrode material layer 336 may be made of titanium (Ti), titanium nitride (TiN), tantalum (Ta), tantalum nitride (TaN), platinum (Pt), iridium (Ir), ruthenium (Ru), aluminum (Al), copper (Cu), gold (Au), tungsten (W), and tungsten nitride (WN), and may have a thickness ranging from 50 to 300 angstroms, but not limited thereto. The top electrode material layer 336 and the bottom electrode material layer 332 may have the same or different materials.

Figure 14:
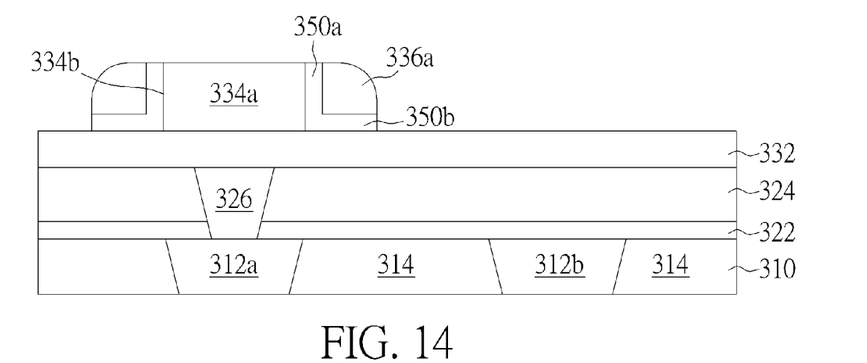
Figure 15:
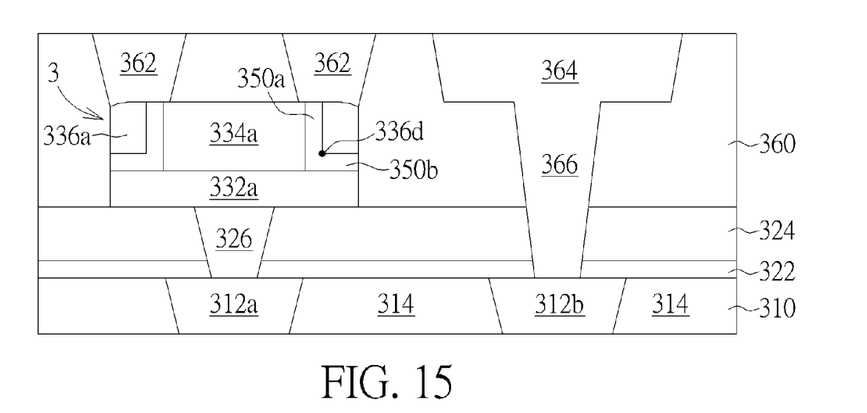

Please refer to FIG. 14 and FIG. 15. Subsequently, the first spacer material layer 350 and the top electrode material layer 336 are anisotropically etched to form a first spacer 350a and a top electrode 336a, wherein the first spacer 350a has an L-shaped cross-sectional profile, vertically covering the sidewall of the dielectric layer 334a and has an extending portion 350b laterally covering the bottom electrode material layer 332. The first spacer 350a is disposed on the first spacer 350a and is completely separated from the bottom electrode material layer 332 by the first spacer 350a. After that, the bottom electrode material layer 332 is partially removed to form the bottom electrode 332a by using the dielectric layer 334a, the first spacer 150a and the top electrode 336a as an etching mask during an etching process, and the RRAM cell 3 according to the third embodiment as shown in FIG. 15 is thereby obtained. Other interconnecting structures such as the interlayer dielectric layer 360, the metal 364 and the via 362 may be formed by typical BEOL process. According to the third embodiment, the top electrode 336a and the variable-resistance first spacer 350a of the RRAM cell 3 are formed symmetrically on the two sides of the constant-resistance dielectric layer 334a. As shown in FIG. 15, the extending portion 350b of the L-shaped first spacer 350a is sandwiched between the top electrode 336a and the bottom electrode 332a. The bottom corner 336d of the top electrode 350a of the RRAM cell 3 is also encompassed by the first spacer 350a.

Figure 16:
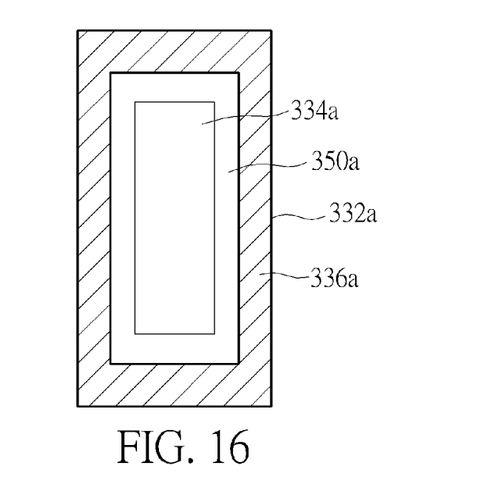
FIG. 16 is a schematic diagram exemplarily showing the top view of a RRAM cell formed according to the third embodiment.

Please refer to FIG. 16, which shows an exemplarily top view of the RRAM cell 3 according to the third embodiment. The top electrode 336a is disposed directly above and overlapping the peripheral region of the bottom electrode 332a, and the dielectric layer 334a is disposed directly above and overlapping the center region of the bottom electrode 332a. The outer-edge of the top electrode 336a and the outer edge of the bottom electrode 332a are aligned. According to the embodiment, both the top electrode 336a and the first spacer 350a have a ring-type shape, and are concentrically surrounding the dielectric layer 334a. The top electrode 336a and the first spacer 350a may be formed in various shapes, such as circular rings, square rings, rectangular rings, symmetrical or asymmetrical polygon rings, or other shapes according to the cell layout structure.

One feature of the third embodiment is that the first spacer 350a and the top electrode 336a are formed self-aligned to the sidewall 334b of the mandrel-like dielectric layer 334a. In this way, a smaller size (particularly the bottom width) even beyond the limitation of conventional photolithography process of the top electrode 336a may be achieved, and consequently a smaller width of the extending portion 350b of the variable-resistance first spacer 350a would be achieved too. This may help to provide a more stable $R_{off}$ of the RRAM cell 3 at the high resistance state. Furthermore, since the bottom corner 336d of the top electrode 336a is also encompassed by the variable-resistance first spacer 350a, a better foaming efficiency, lower threshold voltages $V_{set}$ and $V_{reset}$ and a more stable $R_{on}$ of the RRAM 3 at the low resistance state may be achieved.

Figure 17:
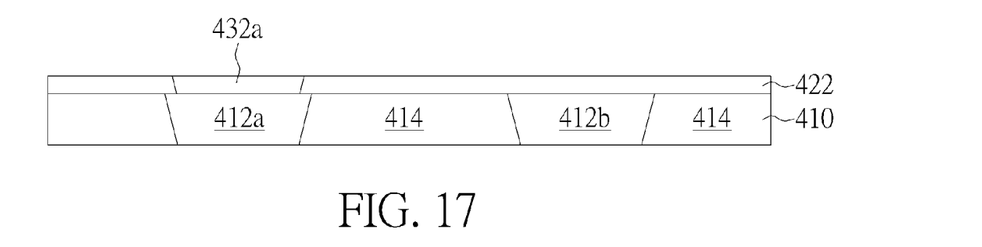
FIG. 17 to FIG. 19 are schematic diagrams illustrating the process of forming a RRAM cell according to a fourth embodiment of the present invention.
Figure 18:
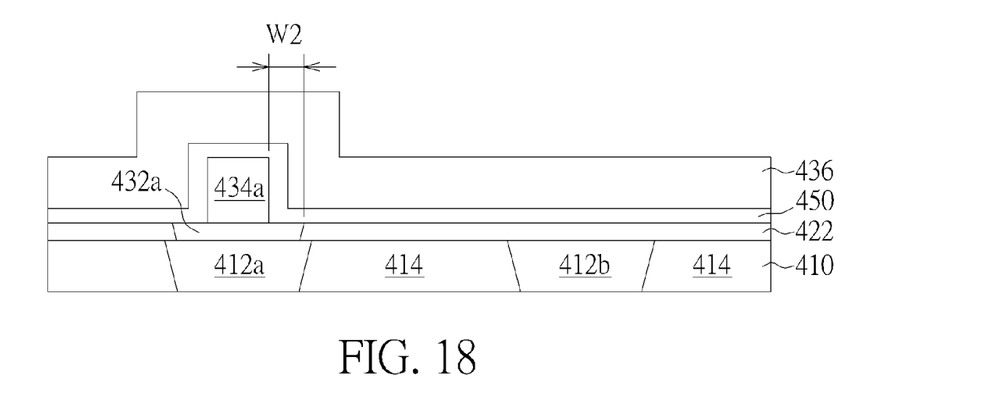
Figure 19:
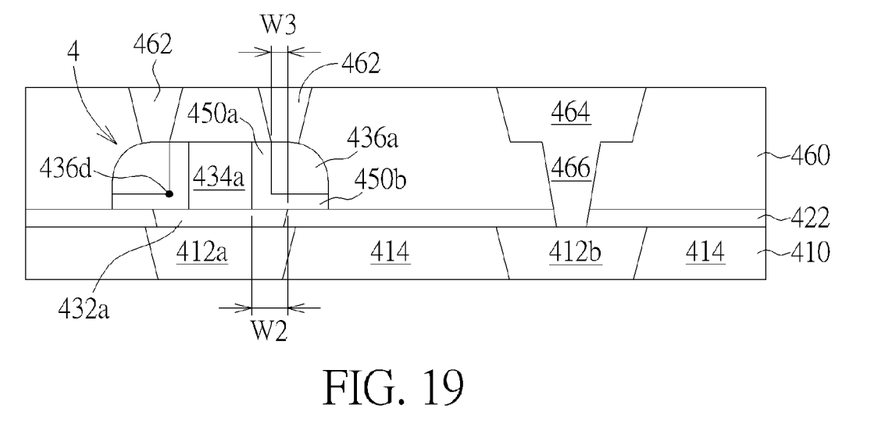
Figure 20:
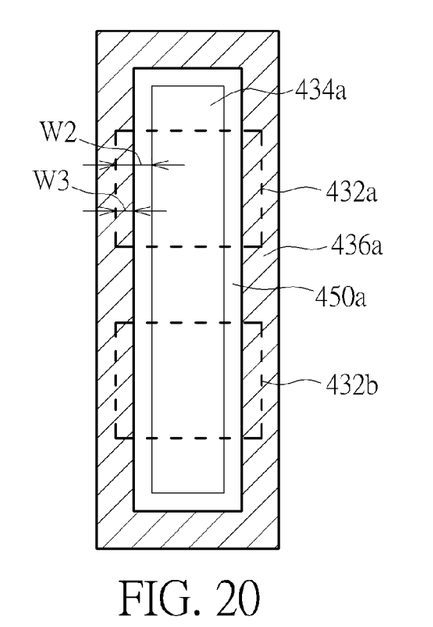
FIG. 20 is a schematic diagram exemplarily showing the top view of a RRAM cell formed according to the fourth embodiment.

FIG. 17 to FIG. 19 are schematic diagrams illustrating the process of forming a RRAM cell 4 according to a fourth embodiment. FIG. 20 exemplarily shows a top view of the RRAM cell 4. Similar to the third embodiment, the top electrode 436a and the first spacer 450a are formed surrounding the sidewall of the dielectric layer 434a, however, in the fourth embodiment, the bottom electrode 432a is formed before the step of forming the dielectric layer 434a.

Please refer to FIG. 17. A substrate 410 having a metal 412a and a metal 412b formed in an interlayer dielectric 414 is provided. A barrier 422 is then formed on the substrate 410. A bottom electrode 432a is formed in formed in the barrier 422 and directly above the metal 412a to electrically couple with the metal 412a. The process of forming the bottom electrode 432a may include performing a first patterning process to define the opening (not shown) of the bottom electrode 432a in the barrier 422, and then depositing a bottom electrode material layer on the barrier 422 and completely filling the opening. The bottom electrode material layer may include titanium (Ti), titanium nitride (TiN), tantalum (Ta), tantalum nitride (TaN), platinum (Pt), iridium (Ir), ruthenium (Ru), aluminum (Al), copper (Cu), gold (Au), tungsten (W), and tungsten nitride (WN), but not limited thereto. The excess bottom electrode material layer outside the opening is then removed and the bottom electrode 432a is obtained.

Please refer to FIG. 18. A dielectric material layer (not shown) is then formed on the substrate 410, blanketly covering the bottom electrode 432a and the barrier layer 422. The dielectric material layer may be made of silicon oxide (SiO2), silicon nitride (SiN) or silicon carbon nitride (SiCN), but not limited thereto. Preferably, the dielectric material layer is made of silicon nitride (SiN) or silicon carbon nitride (SiCN). After that, a second patterning process is performed to pattern the dielectric material layer into the dielectric layer 434a. It is noteworthy that the bottom electrode 432a is not completely overlapped by the dielectric layer 434a, wherein the dielectric layer 434a only overlaps a center region of the bottom electrode 432a, and exposes a peripheral region of the bottom electrode 432a. The exposed portion of the bottom electrode 432a may have a pre-determined width $W_2$. A first spacer material layer 450 and a top electrode material layer 436 are then formed successively on the substrate 410, blanketly and conformally covering the barrier 422, the exposed portion of the bottom electrode 432a and the dielectric layer 434a, as shown in FIG. 18. The first spacer material layer 450 may be made of variable-resistance materials including nickel oxide (NiO), titanium dioxide (TiO), zinc oxide (ZnO), zirconium oxide (ZrO), hafnium oxide (HfO), tantalum oxide (TaO) or other transition metal oxides (TMO), and may have a thickness ranging from 50 to 200 angstroms, but not limited thereto. The top electrode material layer 436 may be made of titanium (Ti), titanium nitride (TiN), tantalum (Ta), tantalum nitride (TaN), platinum (Pt), iridium (Ir), ruthenium (Ru), aluminum (Al), copper (Cu), gold (Au), tungsten (W), and tungsten nitride (WN), but not limited thereto. The top electrode material layer 436 may have a thickness ranging from 500 to 1000 angstroms, but not limited thereto. The top electrode material layer 436 may have the same or different materials as the bottom electrode 432a.

Please refer to FIG. 19. The first spacer material layer 450 and the top electrode material layer 436 are then anisotropically etched to form a first spacer 450a and a top electrode 436a, and the RRAM cell 4 according to the fourth embodiment is obtained. The first spacer 450a has an L-shaped cross-sectional profile wherein the vertical portion covers the sidewall of the dielectric layer 434a and the laterally extending portion 450b covers the exposed portion of the bottom electrode 432a. Other interconnecting structures such as the interlayer dielectric layer 460, the metal 464 and the via 462 are then formed by, for example, typical BEOL processes. It is noteworthy that in the fourth embodiment, the width $W_2$ of the exposed bottom electrode 432a should be large enough to form an overlapping width $W_3$ between the top electrode 436a and the bottom electrode 432a. According to an embodiment, the width W3 may range from 0 to 150 angstroms. Preferably, the width W3 ranges from 50 to 100 angstroms. The first spacer 450a of the RRAM cell 4 also has an L-shaped cross-sectional profile having an extending portion 450b disposed between to completely separate the top electrode 436a and the bottom electrode 432a. The same as the RRAM cells illustrated previously, a bottom corner 436d of the top electrode 436a is encompassed by the variable-resistance first spacer 450a. Therefore the RRAM cell 4 according to the fourth embodiment may also have an improved foaming efficiency, lower threshold voltages $V_{set}$ and $V_{reset}$ and more stable $R_{on}$ and $R_{off}$.

Please refer to FIG. 20, showing an exemplary top view of the RRAM cell 4 according to the fourth embodiment. It is noteworthy that, the bottom electrode 432a and the mandrel-like dielectric layer 434a are defined in different patterning processes, that is, the first patterning process and the second patterning process. In this way, the cell layout pattern of the RRAM cell 4 is not limited to a top electrode coupling to only a bottom electrode. A more flexible and compact cell layout structure may be provided. For example, as shown in FIG. 20, a 1T2R cell may be obtained conventionally by forming a top electrode coupled with two individual bottom electrodes. In other embodiments, it is also possible to form a top electrode coupled to more than two bottom electrodes, and vice versa.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A resistive random-access memory cell, comprising:
a bottom electrode;
a top electrode overlapping on the bottom electrode; and
a resistance layer disposed between the top electrode and the bottom electrode, comprising:
a constant resistance portion; and
a variable resistance portion encompassing the constant resistance portion.
2. The resistive random-access memory cell according to claim 1, wherein the constant resistance portion comprises silicon oxide.
3. The resistive random-access memory cell according to claim 1, wherein the variable resistance portion comprises transition metal oxides.
4. The resistive random-access memory cell according to claim 1, wherein the top view of the variable resistance portion is a rectangle ring or a circular ring.
5. A resistive random-access memory cell, comprising:
a bottom electrode;
a top electrode overlapping on the bottom electrode;

a dielectric layer having a constant resistance disposed between the top electrode and the bottom electrode;

a first spacer having a variable resistance disposed on the bottom electrode, covering the sidewall of the top electrode and having an extending portion completely filling a recess between the top electrode, the bottom electrode and the dielectric layer; and a second spacer disposed on the bottom electrode and covering the sidewall of the first spacer.

6. The resistive random-access memory cell according to claim 5, wherein the dielectric layer comprises silicon oxide.

7. The resistive random-access memory cell according to claim 5, wherein the first spacer comprises transition metal oxide.

8. The resistive random-access memory cell according to claim 5, wherein the second spacer comprises SiN, SiON or SiCN.

9. The resistive random-access memory cell according to claim 5, wherein the top electrode and the bottom electrode comprise metal.

10. The resistive random-access memory cell according to claim 5, wherein the first spacer has an L-shaped cross-sectional profile.

11. The resistive random-access memory cell according to claim 10, wherein the second spacer is in direct contact with the bottom electrode.

12. The resistive random-access memory cell according to claim 5, wherein the first spacer has a reverse-T shape, and has another extending portion disposed between the second spacer and the bottom electrode.

13. The resistive random-access memory cell according to claim 5, wherein the bottom electrode has an area larger than that of the top electrode.

14. A resistive random-access memory cell, comprising:
a bottom electrode;
a dielectric layer having a constant resistance disposed on the bottom electrode and overlapping a region of the bottom electrode;
an L-shaped first spacer having a variable resistance covering a sidewall of the dielectric layer and the bottom electrode; and
a top electrode disposed on the L-shaped first spacer and overlapping a portion of the bottom electrode wherein the top electrode and the bottom electrode are separated by the L-shaped first spacer.

15. The resistive random-access memory cell according to claim 14, wherein a corner of the top electrode is directly above the bottom electrode and encompassed by the L-shaped first spacer.

16. The resistive random-access memory cell according to claim 14, wherein the top electrode is completely overlapping on the bottom electrode and has a sidewall aligning to a sidewall of the bottom electrode.

17. The resistive random-access memory cell according to claim 14, wherein the top electrode is partially overlapping on the bottom electrode.

18. The resistive random-access memory cell according to claim 14, wherein the dielectric layer comprises silicon oxide.

19. The resistive random-access memory cell according to claim 14, wherein the L-shaped first spacer comprises transition metal oxide.

20. The resistive random-access memory cell according to claim 14, wherein the top electrode and the bottom electrode comprise metal.

* * * * *